(12) United States Patent
Liu et al.

(10) Patent No.: US 11,485,907 B2
(45) Date of Patent: Nov. 1, 2022

(54) NITRIDE LUMINESCENT MATERIAL AND LIGHT EMITTING DEVICE COMPRISING SAME

(71) Applicants: GRIREM ADVANCED MATERIALS CO., LTD., Beijing (CN); GUOKE RE ADVANCED MATERIALS CO., LTD., Langfang (CN)

(72) Inventors: Ronghui Liu, Beijing (CN); Yuanhong Liu, Beijing (CN); Xia Zhang, Beijing (CN); Wei Gao, Beijing (CN); Xiaole Ma, Beijing (CN); Huibing Xu, Beijing (CN)

(73) Assignees: GRIREM ADVANCED MATERIALS CO., LTD., Beijing (CN); GUOKE RE ADVANCED MATERIALS CO., LTD., Langfang (CN)

( * ) Notice: Subject to any disclaimer, the term of this patent is extended or adjusted under 35 U.S.C. 154(b) by 108 days.

(21) Appl. No.: 16/469,114

(22) PCT Filed: Sep. 29, 2018

(86) PCT No.: PCT/CN2018/108818
§ 371 (c)(1),
(2) Date: Jun. 12, 2019

(87) PCT Pub. No.: WO2019/153760
PCT Pub. Date: Aug. 15, 2019

(65) Prior Publication Data
US 2021/0403808 A1    Dec. 30, 2021

(30) Foreign Application Priority Data
Feb. 12, 2018 (CN) .......................... 201810147245.5

(51) Int. Cl.
*C09K 11/79* (2006.01)
*C09K 11/77* (2006.01)
(Continued)

(52) U.S. Cl.
CPC ........ *C09K 11/77927* (2021.01); *C01F 17/30* (2020.01); *H01L 33/502* (2013.01); *C01P 2006/60* (2013.01)

(58) Field of Classification Search
CPC ..................... C09K 11/77927; C09K 11/7792
(Continued)

(56) References Cited

FOREIGN PATENT DOCUMENTS

| | | | |
|---|---|---|---|
| CN | 105400515 A | 3/2016 | |
| CN | 107573937 A | 1/2018 | |
| WO | WO-2020015412 A1 * | 1/2020 | ......... C09K 11/0883 |

OTHER PUBLICATIONS

Mei. Lefu Broadband Absorption and Near-Infrared Quantum Cutting in Ce3+13 Tb3+—Yb3+ Co-Doped Y 4Si2O7N2 Phosphor via Energy Transfer Science of Advanced Materials 31.12 2014(Dec. 31, 2014) vol. 6-12, Relevant to Claims 1-13.

(Continued)

*Primary Examiner* — Christopher M Raabe
(74) *Attorney, Agent, or Firm* — Dragon Sun Law Firm, PC; Jinggao Li, Esq.; Nathaniel Perkins

(57) ABSTRACT

The present disclosure relates to the technical field of luminescent materials, and more particularly, to a nitride luminescent material and a light emitting device comprising the luminescent material. The nitride luminescent material recited in the present disclosure includes an inorganic compound with the structural composition $R_wQ_xSi_yN_z$, the excitation wavelength of the luminescent material is between 300-650 nm, and the emission main peak of the NIR light region is broadband emission between 900-1100 nm; the excitation wavelength of the luminescent material is rela- (Continued)

tively broad and capable of excellent absorption of ultraviolet visible light, and has more intensive NIR emission as compared with NIR organic luminescent materials and inorganic luminescent materials of other systems, so it is an ideal application material for NIR devices.

20 Claims, 6 Drawing Sheets

(51) Int. Cl.
    *C01F 17/30*     (2020.01)
    *H01L 33/50*     (2010.01)
(58) Field of Classification Search
    USPC .................................................. 252/301.4 R
    See application file for complete search history.

(56) References Cited

OTHER PUBLICATIONS

Yi. Xiong Multifunctionalities of Near-Infrared Upconversion Luminescence, Optical Temperature Sensing and Long Persistent Luminescence in La3Ga5GeO14:Cr3+, Yb3+, Er3+ and Their Potential Coupling RSC Advances 28.5 J'.1 2015(May 28, 2015), Relevant to Claims 1-13.
PCT search report of PCT/CN2018/108818.
Written opinion of PCT/CN2018/108818.

* cited by examiner

US 11,485,907 B2

NITRIDE LUMINESCENT MATERIAL AND LIGHT EMITTING DEVICE COMPRISING SAME

This application is a national stage application of PCT Application No. PCT/CN2018/108818. This application claims priority from PCT Application No. PCT/CN2018/108818, filed Sep. 29, 2018, and CN Application No. 201810147245.5, filed Feb. 12, 2018, the contents of which are incorporated herein in the entirety by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE INVENTION

The present disclosure relates to the technical field of luminescent materials, and more particularly relates to a nitride luminescent material and a light emitting device comprising the luminescent material.

BACKGROUND OF THE RELATED ART

Near infrared light (NIR) being electromagnetic waves has wavelengths in the range of 700-2500 nm, and was the invisible light region earliest discovered by people. Within the NIR region the light is great in scattering effect and penetrating depth; very few light intensity is absorbed, and its wavelength is so short that it cannot be absorbed by glass or quartz medium, and has wide applications in such fields as harmless removal of biological tissues, astronomical measurements, and fiber communications, so there are increasingly more researches and reports on NIR technology and applications.

Rare earth ion (4f) NIR light emission has characteristics in terms of high intensity, narrow line width, long life and small background, and especially advantageous in such aspects as light signal amplification, laser system, and fluoroimmunoassay. This series of advantages are incomparable by other NIR light emitting materials. With the deepening of NIR researches and widening of its application ranges, especially with the developments in such fields as fiber communications, public security and bio-medical treatment, there is an urgent need for an NIR material having excellent light emitting properties. While NIR lights about 1000 nm are capable of being used as high-efficiency solar spectrum conversion materials, and have great potential in such aspects as low-threshold NIR lasers, commercial counterfeiting and enhancement of C—Si solar energy battery conversions.

Currently available modes for acquiring NIR short-wave lights are mainly by way of infrared chips, or halogen lamps through light splitting, or photoluminescent transition metals or oxides of rare-earth metals, or photoluminescent organic complexes (Chemistry Letters, 2004, 33:50-51; Advanced Functional Materials, 2002, 12:745-751; Annual Conference of Chinese Chemical Society, 2016). However, currently available NIR light emitting devices are generally problematic in terms of excitation low efficiency and high production cost of the NIR chips as used, while the use of halogen lamps requires the filtering of light, whereby most lights are split to engender low use efficiency. Further, as halogen lamps generate great amount of thermal energy, they are not applicable to small-scale devices. Furthermore, currently available photoluminescent materials are not mature in both equipment and technology, and the NIR spectrum part is low in emission efficiency and inferior in stability, so these constitute the biggest bottleneck restricting their application. Therefore, it is still one of the working emphases to continue to search for suitable systems, and to analyze their structures and their relationship with regard to NIR light emission properties.

Therefore, a heretofore unaddressed need exists in the art to address the aforementioned deficiencies and inadequacies.

SUMMARY OF THE INVENTION

The technical problem to be solved by the present disclosure is to provide a nitride luminescent material capable of achieving highly efficient NIR lights (900-1100 nm) emission under excitation by blue light, near ultraviolet light and red light.

The technical problem to be further solved by the present disclosure is to provide a light emitting device comprising the luminescent material, so as to solve problems concerning inferior stability and low emission efficiency in prior-art NIR luminescent materials and light emitting devices.

In order to solve the above technical problems, the present disclosure is directed to a nitride luminescent material comprising an inorganic compound with the chemical composition $R_wQ_xSi_yN_z$, wherein the R element is selected from one of a Yb element, an Nd element or an Er element, and comprises a Cr element, or Cr and Ce elements; the Q element is selected from one or two of an La element, a Gd element, an Lu element, a Y element or an Sc element; and the parameters w, x, y and z satisfy the following relations: $0<w\leq0.5$, $2.5\leq x+w\leq3.5$, $5.5\leq y\leq6.5$, $10\leq z\leq12$.

Preferably, in the nitride luminescent material, the parameters w, x, y and z satisfy the following relations: $0.01\leq w\leq0.3$, $(x+w):y:z=3:6:11$.

More preferably, the R element is Cr element and Yb element.

More preferably, the R element is Cr element, Ce element and Er element.

More preferably, the inorganic compound has a crystal structure the same as $La_3Si_6N_{11}$.

More preferably, the Q element is La element.

The emission spectrum of the NIR luminescent material recited in the present disclosure has the highest peak intensity as A in the range of 900-1100 nm, and the highest peak intensity as B in the range of 700-750 nm, where $0.95\leq A/(A+B)\leq0.99$.

The method for preparing the NIR luminescent material recited in the present disclosure includes the following steps:

step (1): preparing materials according to chemical formula $R_wQ_xSi_yN_z$, selecting monomers, nitrides, oxides of R element and Q element or an alloy thereof and $Si_3N_4$, and weighting and taking corresponding raw materials according to molar proportion demanded by the aforementioned chemical formula and uniformly mixing the raw materials;

step (2) placing the mixture obtained in step (1) into a container and calcinating the same in high temperature under nitrogen or other non-oxidizing atmosphere, with the highest calcinating temperature being 1500-2000° C. and the calcinating time being 5-40 h; and step (3) subjecting the calcinated product obtained in step (2) to crushing, washing, sieving and drying processes to obtain the NIR luminescent material.

The luminescent material used in the present disclosure may be prepared by prior-art methods or novel methods to be discovered in the future.

The luminescent material obtained by the present disclosure can be used to manufacture light emitting devices, and infrared light emitting devices manufactured from the luminescent material according to the present disclosure can be applied in such fields as NIR shortwave band detection and medical treatment.

The present disclosure further discloses a light emitting device, which comprises a phosphor and an excitation light source, and the phosphor comprises the nitride luminescent material.

As a preferred structure, the light emitting device comprises a semiconductor chip, a light converting part I and a light converting part the light converting part I absorbs a primary light emitted by the semiconductor chip, and converts the light into a secondary light with higher wavelength; the light converting part II absorbs the primary light of the semiconductor chip and the secondary light emitted by the light converting part I, and converts the light into a tertiary light with higher wavelength.

The light converting part I at least comprises a nitride luminescent material I, and the light converting part II at least comprises the claimed nitride luminescent material.

Preferably, the nitride luminescent material I is a luminescent material capable of emitting an emitted light with a peak wavelength of 580-650 nm under excitation by the semiconductor chip.

Preferably, in the light emitting device, the nitride luminescent material I is selected from one or two luminescent material(s) with a general formula of $M_mAl_aSi_bN_c:Eu_d$ or $M_eSi_fN_g:Eu_n$, wherein the M element at least comprises a Ca element and/or an Sr element; and the parameters m, a, b, c, d, e, f, g and n satisfy the following relations: $0.8 \leq m \leq 1.2$, $0.8 \leq a \leq 1.2$, $0.8 \leq b \leq 1.2$, $2 \leq c \leq 4$, $0.0001 \leq d \leq 0.1$, $1.8 \leq e \leq 2.2$, $4 \leq f \leq 6$, $7 \leq g \leq 9$, and $0.0001 \leq n \leq 0.1$.

Preferably, the nitride luminescent material I has a crystal structure as $CaAlSiN_3$ or $Sr_2Si_5N_8$.

Preferably, in the nitride luminescent material I, the M element is Ca and Sr elements, wherein the Sr element has a molar percentage z in the M element, and $80\% \leq z \leq 100\%$.

The nitride luminescent material I used in the present disclosure may be prepared by prior-art methods or novel methods to be discovered in the future.

Preferably, the semiconductor chip has an emission peak wavelength in the range of 350-500 nm, preferably 440-460 nm.

The nitride luminescent material recited in the present disclosure comprises an inorganic compound with the structural composition $R_wQ_xSi_yN_z$, the excitation wavelength of the luminescent material is between 300-650 nm, and the emission main peak of the NIR light region is broadband emission between 900-1100 nm; the excitation wavelength of the luminescent material is relatively broad and capable of excellent absorption of ultraviolet visible light, and has more intensive NIR emission as compared with NIR organic luminescent materials and inorganic luminescent materials of other systems. The luminescent material recited in the present disclosure is of the $La_3Si_6N_{11}$ structure, the structure is very stable, with space group thereof as P4bm, both metal cation and silicon ion have two types of lattice sites, the crystal structure is formed by three-dimensional network formed by $SiN_4$ tetrahedron, and has a highly condensed netlike structure, whereby $La_3Si_6N_{11}$ exhibits excellent temperature characteristics, provides important structural support for the fabrication of novel infrared luminescent material with excellent properties and thermal stability, and enables the fabricated luminescent material to have excellent heat resistance, water resistance and light stability; at the same time, the material is simple in the preparing process and low in production cost, so it is an ideal application material for NIR devices.

By utilizing the luminescent material recited in the present disclosure, and through forming the light emitting device as noted above, it is possible to obtain NIR lights under excitation by different blue light, ultraviolet light and red light, and to apply not only in such fields as NIR shortwave band detection and medical-treatment, but also to avoid disadvantages of other modes of obtaining NIR lights; the light emitting device according to the present disclosure is high in emission efficiency, low in production cost, and applicable to devices of various types.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

Figure 1:
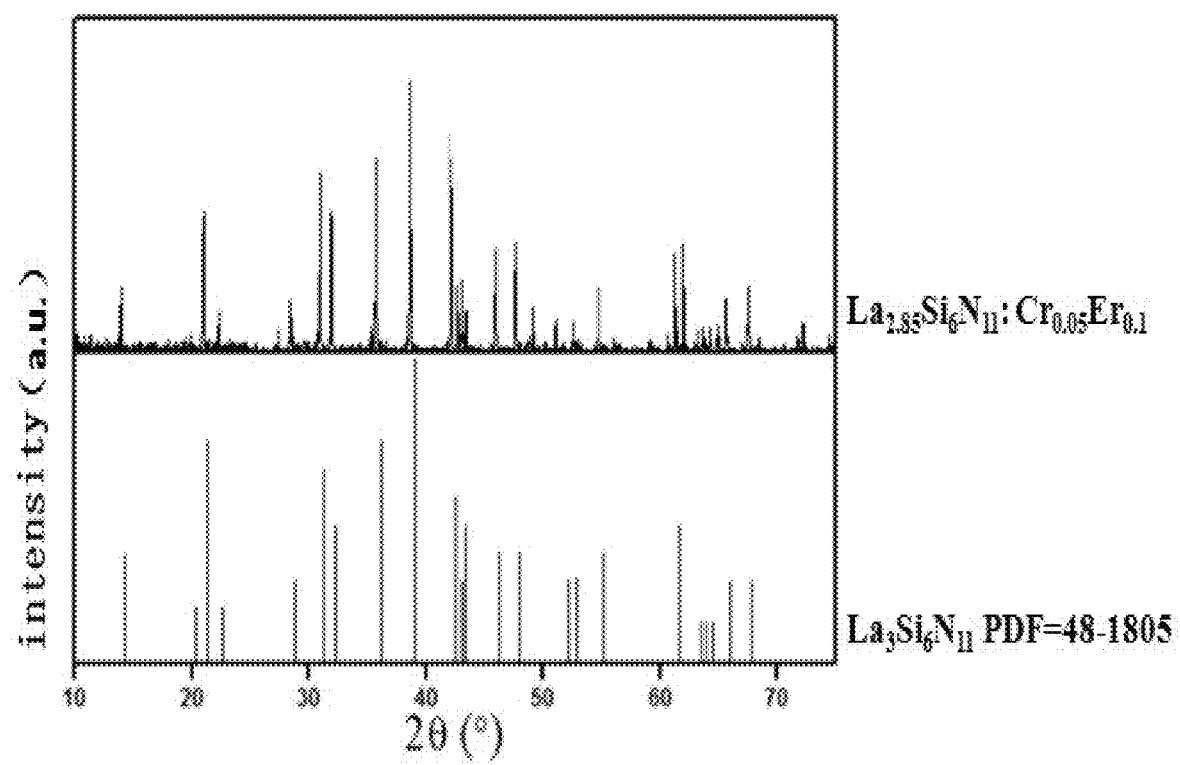
FIG. 1 is an XRD spectrum of an NIR luminescent material fabricated according to Example 1 of the present disclosure.
Figure 2:
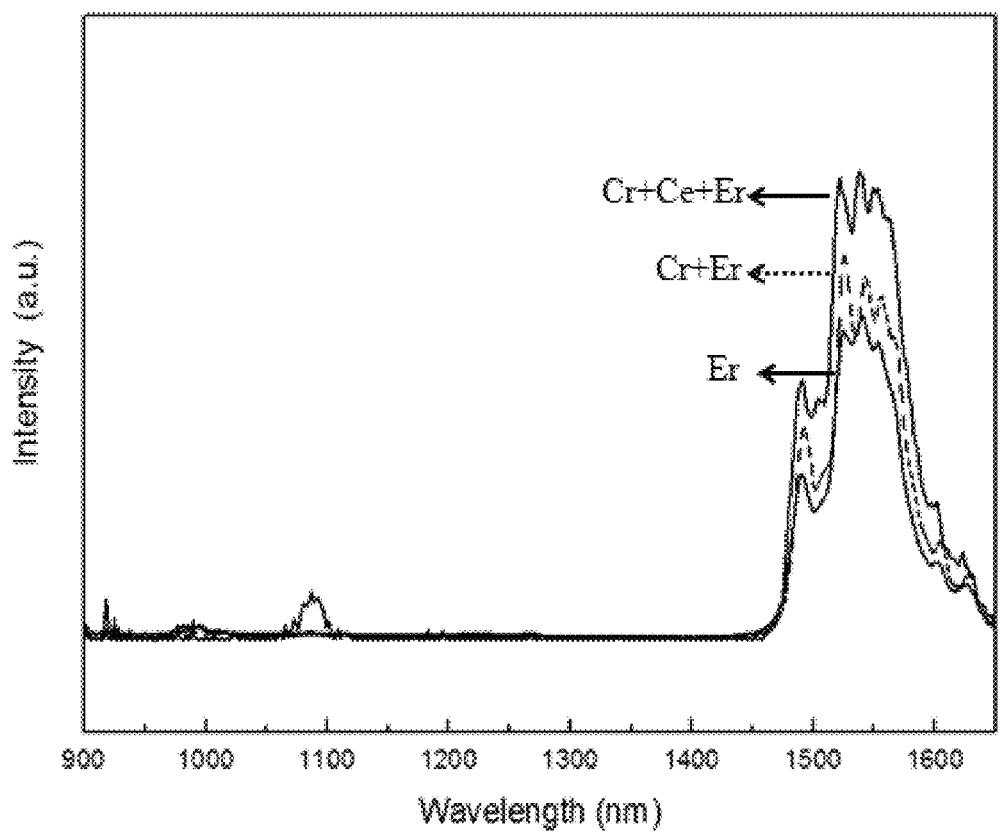
Figure 3:
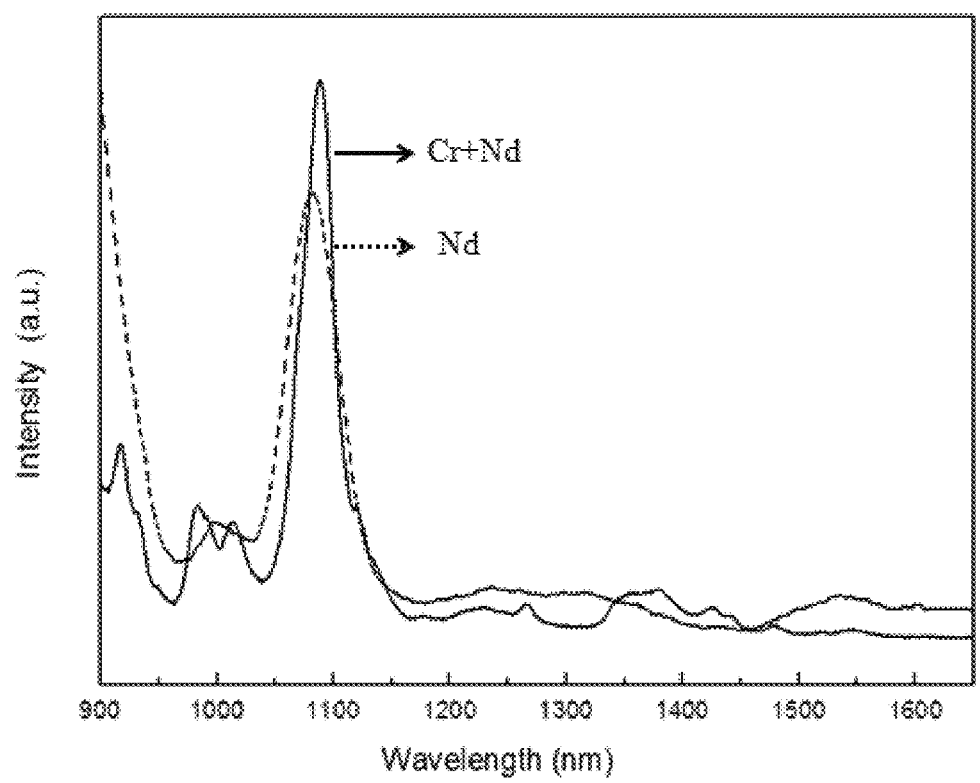
Figure 4:
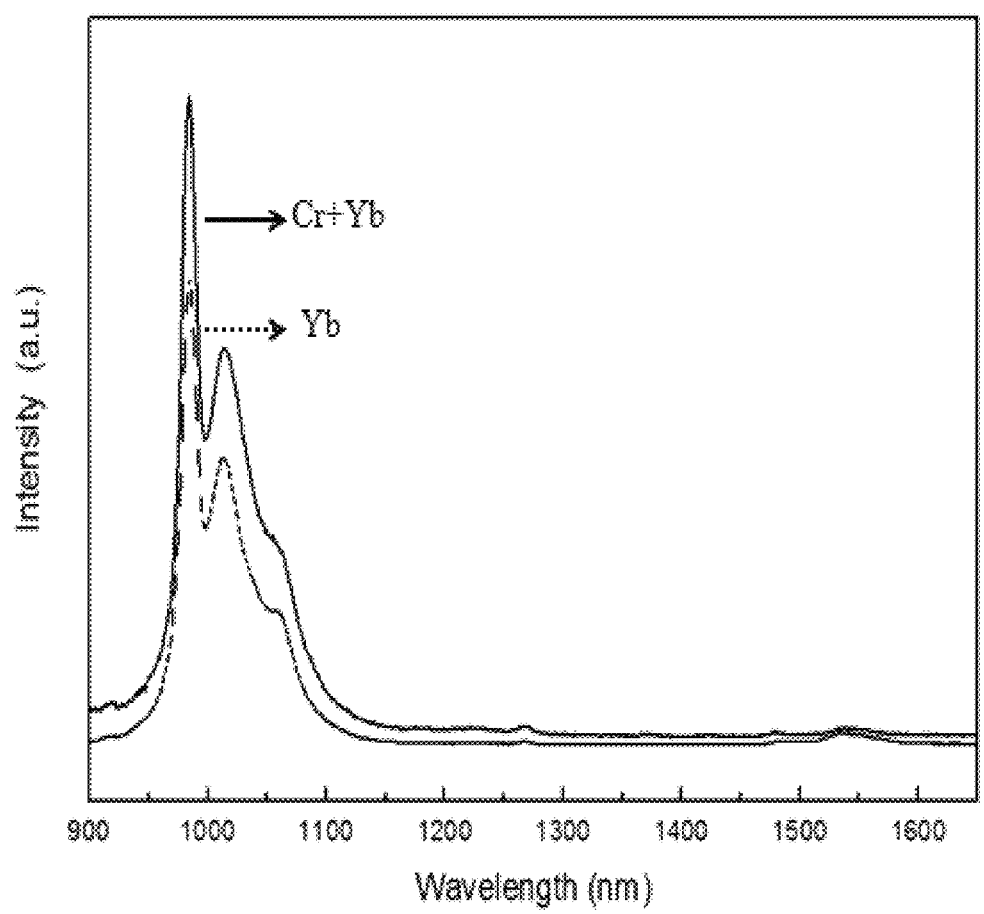
Figure 5:
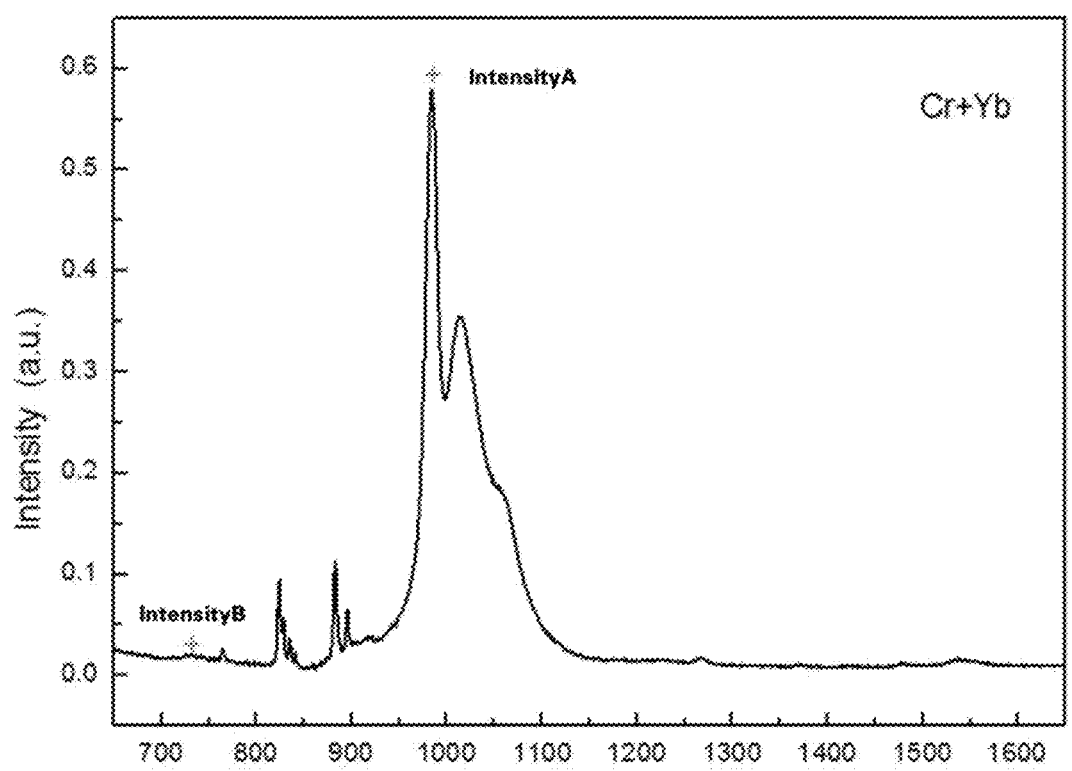
Figure 6:
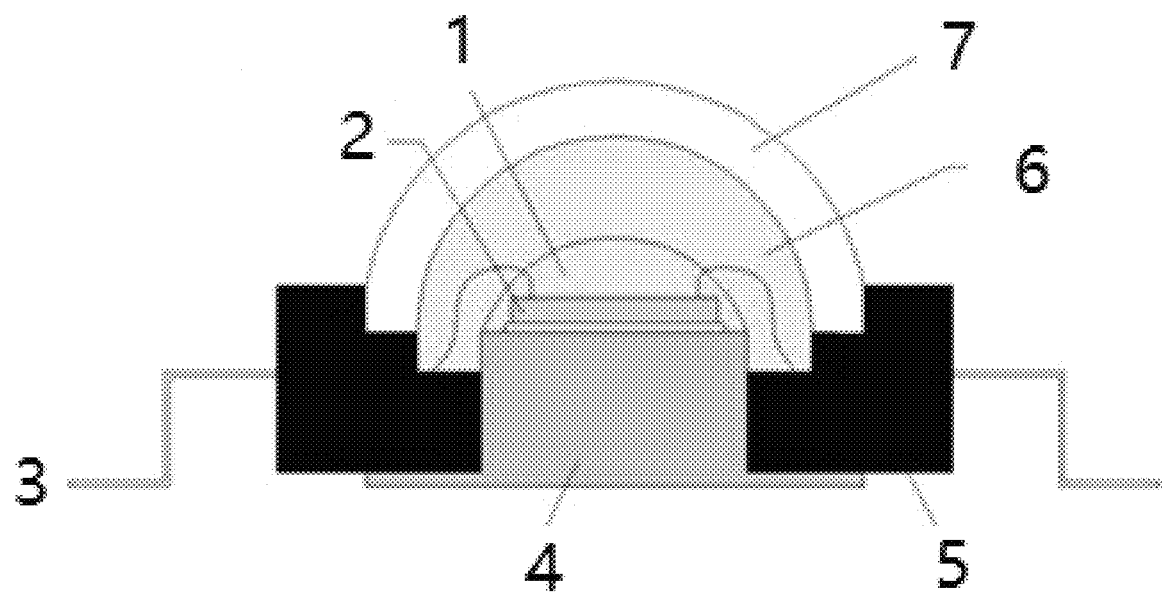

In order that the contents of the present disclosure could be more easily and clearly understood, specific examples are combined with accompanying drawings below to make further detailed description about the present disclosure. In the drawings:

FIG. 2 is a diagram showing emission spectra of NIR luminescent materials fabricated according to Examples 1 and 2 of the present disclosure and a luminescent material in Comparative Example 1, with the excitation wavelength being 460 nm;

FIG. 3 is a diagram showing emission spectra of an NIR luminescent material fabricated according to Example 3 of the present disclosure and a luminescent material of Comparative Example 2, with the excitation wavelength being 460 nm;

FIG. 4 is a diagram showing emission spectra of an NIR luminescent material fabricated according to Example 4 of the present disclosure and a luminescent material of Comparative Example 3, with the excitation wavelength being 460 nm;

FIG. 5 is a diagram showing emission spectrum of an NIR luminescent material fabricated according to Example 4 of the present disclosure; and FIG. 6 is a diagram schematically illustrating the structure of the light emitting device recited in the present disclosure.

Reference numerals in the accompanying drawings:
1—light converting part I, 2—semiconductor chip, 3—pin, 4—heat sink, 5—base, 6—light converting part II, and 7—plastic lens.

DETAILED DESCRIPTION

To facilitate comprehension of the present disclosure, examples of the present disclosure are enumerated below. As should be clear to persons skilled in the art, the examples are merely used to help comprehend the present disclosure, rather than to specifically restrict the present disclosure. As should be noted, under the circumstance of not being conflictive, examples and features in the examples of the present application can be mutually combined. The present disclosure will be described in detail below in conjunction with the Examples.

As has been noted in the Background of the Related Art section, the currently available NIR light emitting device is problematic in low excitation efficiency and high production cost of the infrared chip used. The use of halogen lamp requires the filtering of light, whereby most lights are split to engender low use efficiency; moreover, as halogen lamp generates great amount of thermal energy, it is not applicable to small-scale devices. Furthermore, currently available photoluminescent materials are not mature in both equipment and technology, and the NIR spectrum part is low in emission efficiency and inferior in stability, so these constitute the biggest bottleneck restricting their application.

There is provided, in a type example of the present disclosure, a nitride luminescent material comprising an inorganic compound with the chemical composition $R_wQ_xSi_yN_z$, wherein the R element is selected from one of a Yb element, an Nd element or an Er element, and comprises a Cr element, or Cr and Ce elements; the Q element is selected from one or two of an La element, a Gd element, an Lu element, a Y element or an Sc element; and $0<w\le0.5$, $2.5\le x+w\le3.5$, $5.5\le y\le6.5$, $10\le z\le12$.

The traditional NIR luminescent material with single doping of Yb, Nd or Er in the prior art is relatively low in quantum efficiency, thereby restricting the use thereof. An effective way to overcome this deficiency is to co-dope such broadband emission rare-earth elements as $Cr^{3+}$ and/or $Ce^{3+}$ in the above NIR luminescent material, and quantum efficiency and emission intensity can be enhanced via resonant energy transfer between the sensitizer(s) $Cr^{3+}$ and/or $Ce^{3+}$ and the activators Yb, Nd, Er. Applying the technical solution of the present disclosure, by adjusting the proportion of La:Si:N and the sensitizer and activator ions, $La_3Si_6N_{11}$ crystal structure can be formed that must include the sensitizer $Cr^{3+}$ or any one of the sensitizers $Cr^{3+}$ and $Ce^{3+}$ and the activators Yb, Nd, Er, whereby the activator center acquires higher transition energy under actions of trivalent rare-earth ions and the Si—N tetrahedron field, so as to improve the problem of low light efficiency of currently available nitride luminescent materials and to obtain highly efficient emission; moreover, the $La_3Si_6N_{11}$ crystal structure is used as a matrix to prepare highly thermally stable luminescent material, so as to be suitable for devices of high-energy density excitation.

The crystal structure of the aforementioned nitride luminescent material according to the present disclosure is constructed by an M-A polyhedron, while it is possible to obtain differently structured luminescent materials by linking Q and Si—N tetrahedron angle-by-angle or side-by-side. In order that the nitride luminescent material according to the present disclosure has a crystal structure the same as $La_3Si_6N_{11}$ without introducing other impurity phases thereto, when the Q element in the nitride luminescent material according to the present disclosure is selected from one or two from the trivalent rare-earth elements La, Gd, Lu, Y and Sc, it is possible to guarantee strict growth of the lattices of the luminescent material to obtain a highly stably luminescent material, but the introducing amount of the above elements should be proper—when x+w<2.5, pure phase cannot be generated in the calcinating process due to difference in the proportions of the elements to thereby lead to inferiority of properties of the luminescent material; when x+w<3.5, excessive leftover materials likewise affect generation of pure phase of the luminescent material, and temperature characteristics of the luminescent material would change for the worse. Preferably $2.5\le x+w\le3.5$, it is possible to control impurity phases as less as possible or even nil, whereby the crystal structure of the nitride luminescent material is purer, and the luminescent material is provided with better emission properties.

When z<10 or z>12, y<5.5 or y>6.5, the internal valence bonds of the crystal are not balanced due to difference in the proportioning of the elements, thereby leading to instability of the structure, and probability for the crystal structure to distort is increased, whereby it is not easy to obtain the ideal luminescent material; when $10\le z\le12$, $5.5\le y\le6.5$, it is possible for the luminescent material composed of the selected elements to have a crystal structure the same as $La_3Si_6N_{11}$.

Yb, Nd, Er as activator ions in the aforementioned nitride luminescent material according to the present disclosure, it has been found after repeated experiments that the most optimum effect can be achieved when the concentration of the activators is defined in the range $0<w\le0.5$. When the content of w is greater than 0.5, on the one hand the ionic radii do not match after entry into the lattice to thereby cause increase in instability of the structure and even generation of impurity phases, and on the other hand, excessive amount of R ions would generate concentration quenching effect due to too small intervals amongst the ions, and emission luminosity would be decreased with the increase in w; more preferably $0.01<w\le0.3$, at the same time, out of consideration for stability of the structure, it is preferable that (x+w):y:z=3:6:11.

Selection of elements of the aforementioned types and amounts already provides the nitride luminescent material thus formed with advantageous effects as high emission intensity and excellent stability. In order to achieve higher emission intensity, in a preferred example of the present disclosure, R at least includes Cr element and/or Ce element, and it is guaranteed that the aforementioned nitride luminescent material has a crystal structure the same as $La_3Si_6N_{11}$. Serving as sensitizers, Cr and/or Ce ions can engender energy transfer with activator ions, as Cr and/or Ce ions can effectively absorb energy and transfer the energy to activator ions to serve as sensitizing function, whereby emission intensity of activators is made higher; due to the sensitizing function of Cr and/or Ce ions in the aforementioned nitride luminescent material according to the present disclosure, infrared emission intensity of activator ions is enhanced, while the light emitting device produced thereby also has higher emission efficiency.

According to differences in specific types, amounts and proportions of elements selected, peak sites of excitation wavelength and peak wavelengths of emission wavelength of the nitride luminescent material according to the present disclosure also slightly differ.

The nitride luminescent material according to the present disclosure can be prepared by methods, such as by the high temperature solid-state method; in a preferred example of the present disclosure, source materials of various elements required by the general formula of the claimed nitride luminescent material are proportionally and uniformly mixed—the source materials of the various elements are preferably selected from monomers or compounds of various metallic or non-metallic elements, wherein the compounds are preferably nitrides; calcination is thereafter performed, and the calcinating atmosphere is preferably conducted within a high-pressure or home-pressure furnace under protection by nitrogen, hydrogen or CO gas to ensure low-oxygen content of the atmosphere; after calcination, holding is performed under the highest temperature for 20 min to 24 h. If the holding time is too short, reaction would be insufficient; if the holding time is too long, grains would abnormally grow, so the holding time is preferably selected as 6-15 h; the product is finally taken out after the temperature within furnace is cooled to below 100° C., and the powder is then subjected to post-processing steps such as milling, acid-washing, sieving and drying.

The present disclosure further provides a light emitting device, which comprises a phosphor and an excitation light source, and the phosphor comprises the NIR luminescent material according to the present disclosure. The light emitting device comprises a semiconductor chip, a light converting part I and a light converting part II; the light converting part I at least comprises a nitride luminescent material I, which emits an emitted light with a peak wavelength of 580-650 nm under excitation by the semiconductor chip; and the light converting part II at least comprises the NIR luminescent material according to the present disclosure. The semiconductor chip has an emission peak wavelength in the range of 350-500 nm, and more preferably an emission peak wavelength in the range of 440-460 nm.

Specific examples will be combined below to further explain the advantageous effects of the present disclosure.

Example 1

The compound contained in the nitride luminescent material of this Example has the structural formula as $La_{2.85}Si_6N_{11}:Cr_{0.05}Er_{0.1}$.

The nitride luminescent material in this Example is $La_{2.85}Si_6N_{11}:Cr_{0.05}Er_{0.1}$ according to components, according to stoichiometric ratio, source materials LaN (99.9%), $Si_3N_4$ (99.9%), $CrO_2$ (99.99%) and $ErO_2$ (99.99%) are precisely weighted and taken. A total of 100 g of the above source materials is placed in a mortar and uniformly mixed in a glove box (oxygen content<1 ppm, water content<1 ppm)—the mortar is of agate material or alumina ceramic material. The mixed powder is placed in a crucible, gently compacted, and then taken out of the glove box and placed into a high-temperature controlled atmosphere furnace; the high-temperature controlled atmosphere furnace starts to rise in temperature after vacuum pumping and introduction of nitrogen gas, with the temperature rising rate being 10° C./min, and nitrogen pressure being 3 MPa. Temperature is held for 20 hours after temperature rises to 1900° C., the power is shut off after temperature holding, and cooling is accompanied by the cooling of furnace. The calcinated sample is taken out, and the final sample is obtained after crushing, milling, impurities-removing, washing, sieving and drying.

The luminescent material produced in this Example is tested by fluorescence spectrum, as shown in FIG. 1 for its XRD spectrum, where it can be seen that the luminescent material has a crystal structure the same as $La_3Si_6N_{11}$.

FIG. 2 shows the luminescent material produced in this Example tested by infrared emission spectrum. As can be seen, the luminescent material is effectively excited by radiation light with wavelength of 460 nm, and is capable of emitting shortwave infrared light in the range of 1500-1575 nm.

Example 2

The compound contained in the nitride luminescent material of this Example has the structural formula as $La_{2.8}Si_6N_{11}:Cr_{0.05}Ce_{0.05}Er_{0.1}$.

The nitride luminescent material in this Example is $La_{2.8}Si_6N_{11}:Cr_{0.05}Ce_{0.05}Er_{0.1}$ according to components, according to stoichiometric ratio, source materials LaN (99.9%), $Si_3N_4$ (99.9%), $CrO_2$ (99.99%) and $ErO_2$ (99.99%) are precisely weighted and taken. A total of 100 g of the above source materials is placed in a mortar and uniformly mixed in a glove box (oxygen content<1 ppm, water content<1 ppm)—the mortar is of agate material or alumina ceramic material. The mixed powder is placed in a crucible, gently compacted, and then taken out of the glove box and placed into a high-temperature controlled atmosphere furnace; the high-temperature controlled atmosphere furnace starts to rise in temperature after vacuum pumping and introduction of nitrogen gas, with the temperature rising rate being 10° C./min, and nitrogen pressure being 3 MPa. Temperature is held for 20 hours after temperature rises to 1900° C., the power is shut off after temperature holding, and cooling is accompanied by the cooling of furnace. The calcinated sample is taken out, and the final sample is obtained after crushing, milling, impurities-removing, washing, sieving and drying.

FIG. 2 is for the luminescent material produced in this Example tested by infrared emission spectrum. As can be seen, the luminescent material is effectively excited by radiation light with wavelength of 460 nm, and is capable of emitting shortwave infrared light in the range of 1500-1575 nm.

Comparative Example 1

The NIR luminescent material in this Comparative Example is $La_{2.9}Si_6N_{11}:Er_{0.1}$ according to components, according to stoichiometric ratio, source materials LaN (99.9%), $Si_3N_4$ (99.9%) and $ErO_2$ (99.99%) are precisely weighted and taken. A total of 100 g of the above source materials is placed in a mortar and uniformly mixed in a glove box (oxygen content<1 ppm, water content<1 ppm)—the mortar is of agate material or alumina ceramic material. The mixed powder is placed in a crucible, gently compacted, and then taken out of the glove box and placed into a high-temperature controlled atmosphere furnace; the high-temperature controlled atmosphere furnace starts to rise in temperature after vacuum pumping and introduction of nitrogen gas, with the temperature rising rate being 10° C./min, and nitrogen pressure being 3 MPa. Temperature is held for 20 hours after temperature rises to 1900° C., the power is shut off after temperature holding, and cooling is accompanied by the cooling of furnace. The calcinated sample is taken out, and the final sample is obtained after crushing, milling, impurities-removing, washing, sieving and drying. Subsequently, the sample is tested by fluorescence spectrum, referring to its infrared emission spectrum as shown in FIG. 2.

As can be seen from comparison between the spectra and emission intensities of Examples 1 and 2 and Comparative Example 1 as shown in FIG. 2, with the addition of the Cr element and with the addition of Cr and Ce elements, the NIR emission intensity of the luminescent material is increased.

Example 3

The nitride luminescent material in this Example is $La_{2.85}Si_6N_{11}:Cr_{0.05}Nd_{0.1}$ according to components, according to stoichiometric ratio, source materials LaN (99.9%), $Si_3N_4$ (99.9%), $CrO_2$ (99.99%) and $Nd_2O_3$ (99.99%) are precisely weighted and taken. A total of 100 g of the above source materials is placed in a mortar and uniformly mixed in a glove box (oxygen content<1 ppm, water content<1 ppm)—the mortar is of agate material or alumina ceramic material. The mixed powder is placed in a crucible, gently compacted, and then taken out of the glove box and placed into a high-temperature controlled atmosphere furnace; the high-temperature controlled atmosphere furnace starts to rise in temperature after vacuum pumping and introduction of nitrogen gas, with the temperature rising rate being 10° C./min, and nitrogen pressure being 3 MPa. Temperature is held for 20 hours after temperature rises to 1900° C., the power is shut off after temperature holding, and cooling is accompanied by the cooling of furnace. The calcinated sample is taken out, and the final sample is obtained after crushing, milling, impurities-removing, washing, sieving and drying. Subsequently, the sample is tested by fluorescence spectrum, referring to its infrared emission spectrum as shown in FIG. 3, where it can be seen that the luminescent material is effectively excited by radiation light with wavelength of 460 nm, and is capable of emitting shortwave infrared light in the range of 1050-1150 nm.

Comparative Example 2

The NIR luminescent material in this Comparative Example is $La_{2.9}Si_6N_{11}:Nd_{0.1}$ according to components, according to stoichiometric ratio, source materials LaN (99.9%), $Si_3N_4$ (99.9%) and $Nd_2O_3$ (99.99%) are precisely weighted and taken. A total of 100 g of the above source materials is placed in a mortar and uniformly mixed in a glove box (oxygen content<1 ppm, water content<1 ppm)— the mortar is of agate material or alumina ceramic material. The mixed powder is placed in a crucible, gently compacted, and then taken out of the glove box and placed into a high-temperature controlled atmosphere furnace; the high-temperature controlled atmosphere furnace starts to rise in temperature after vacuum pumping and introduction of nitrogen gas, with the temperature rising rate being 10° C./min, and nitrogen pressure being 3 MPa. Temperature is held for 20 hours after temperature rises to 1900° C., the power is shut off after temperature holding, and cooling is accompanied by the cooling of furnace. The calcinated sample is taken out, and the final sample is obtained after crushing, milling, impurities-removing, washing, sieving and drying. Subsequently, the sample is tested by fluorescence spectrum, referring to its infrared emission spectrum as shown in FIG. 3.

As can be seen from comparison between the spectra and emission intensities of Example 3 and Comparative Example 2 as shown in FIG. 3, and through comparing technical effects in Example 3, with the addition of the Cr element, the NIR emission intensity of the luminescent material is increased; moreover, in the nitride luminescent material recited in the present disclosure, with the addition of the Cr element, emission intensities of luminescent materials in all Examples are increased by varying degrees.

Example 4

The nitride luminescent material in this Example is $La_{2.85}Si_6N_{11}:Cr_{0.05}Yb_{0.1}$ according to components, according to stoichiometric ratio, source materials LaN (99.9%), $Si_3N_4$ (99.9%), $CrO_2$ (99.99%) and $Yb_2O_3$ (99.99%) are precisely weighted and taken. A total of 100 g of the above source materials is placed in a mortar and uniformly mixed in a glove box (oxygen content<1 ppm, water content<1 ppm)—the mortar is of agate material or alumina ceramic material. The mixed powder is placed in a crucible, gently compacted, and then taken out of the glove box and placed into a high-temperature controlled atmosphere furnace; the high-temperature controlled atmosphere furnace starts to rise in temperature after vacuum pumping and introduction of nitrogen gas, with the temperature rising rate being 10° C./min, and nitrogen pressure being 3 MPa. Temperature is held for 20 hours after temperature rises to 1900° C., the power is shut off after temperature holding, and cooling is accompanied by the cooling of furnace. The calcinated sample is taken out, and the final sample is obtained after crushing, milling, impurities-removing, washing, sieving and drying. Subsequently, the sample is tested by fluorescence spectrum, referring to its infrared emission spectrum as shown in FIG. 4 and FIG. 5, where it can be seen that the luminescent material is effectively excited by radiation light with wavelength of 460 nm, and is capable of emitting shortwave infrared light in the range of 950-1050 nm. Moreover, as can be known from the spectrum in FIG. 5, its emission spectrum has the highest peak intensity as A in the range of 900-1100 nm, and the highest peak intensity as B in the range of 700-750 nm, where A/(A+B) is approximately 0.97.

Comparative Example 3

The NIR luminescent material in this Comparative Example is $La_{2.9}Si_6N_{11}:Yb_{0.1}$ according to components, according to stoichiometric ratio, source materials LaN (99.9%), $Si_3N_4$ (99.9%) and $Yb_2O_3$ (99.99%) are precisely weighted and taken. A total of 100 g of the above source materials is placed in a mortar and uniformly mixed in a glove box (oxygen content<1 ppm, water content<1 ppm)— the mortar is of agate material or alumina ceramic material. The mixed powder is placed in a crucible, gently compacted, and then taken out of the glove box and placed into a high-temperature controlled atmosphere furnace; the high-temperature controlled atmosphere furnace starts to rise in temperature after vacuum pumping and introduction of nitrogen gas, with the temperature rising rate being 10° C./min, and nitrogen pressure being 3 MPa. Temperature is held for 20 hours after temperature rises to 1900° C., the power is shut off after temperature holding, and cooling is accompanied by the cooling of furnace. The calcinated sample is taken out, and the final sample is obtained after crushing, milling, impurities-removing, washing, sieving and drying. Subsequently, the sample is tested by fluorescence spectrum, referring to its infrared emission spectrum as shown in FIG. 4.

As can be seen from comparison between the spectra and emission intensities of Example 4 and Comparative Example 3 as shown in FIG. 4, and through comparing technical effects in Example 4, with the addition of the Cr element, the NIR emission intensity of the luminescent material is increased.

In the materials recited in the present disclosure, infrared emission spectra of all luminescent materials taking Er as the main luminescent center are shown in FIG. 2, infrared emission spectra of all luminescent materials taking Nd as the main luminescent center are shown in FIG. 3, and infrared emission spectra of all luminescent materials taking Yb as the main luminescent center are shown in FIG. 4. As can be seen, with the addition of the Cr element, the NIR emission intensities of the luminescent materials are increased.

Examples 5-21

NIR fluorescent powders recited in Examples 5-39 are prepared by methods similar to those in Examples 1-3, and differ from the latter only in the fact that properly measured compounds are selected according to target stoichiometric ratios, and mixed, milled and calcinated to obtain the desired luminescent materials. Chemical formulae of inorganic compounds of the luminescent materials produced in Examples 5-39 are as shown in Table 1, and relative emission intensities of luminescent materials in Examples 1-39 and Comparative Examples 1-3 are tested and shown in Table 1.

TABLE 1

Relative Emission Intensities of Luminescent Materials in Examples 1-39

| Name | Chemical Composition | Relative Emission Intensity % |
|---|---|---|
| Example 1 | $La_{2.85}Si_6N_{11}Cr_{0.05}Er_{0.1}$ | 125 |
| Example 2 | $La_{2.85}Si_6N_{11}Cr_{0.05}Ce_{0.05}Er_{0.1}$ | 138 |
| Example 3 | $La_{2.85}Si_6N_{11}Cr_{0.05}Nd_{0.1}$ | 128 |
| Example 4 | $La_{2.85}Si_6N_{11}Cr_{0.05}Yb_{0.1}$ | 138 |
| Example 5 | $La_{2.5}Si_6N_{11}Cr_{0.5}$ | 109 |
| Example 6 | $La_{2.6}Si_{5.5}N_{10.43}Cr_{0.4}Yb_{0.1}$ | 125 |
| Example 7 | $La_3Si_{6.375}N_{10.43}Cr_{0.4}Yb_{0.1}$ | 117 |
| Example 8 | $La_{2.4}Si_6N_{10.5}Cr_{0.05}Er_{0.05}$ | 115 |
| Example 9 | $LaScSi_{6.5}N_{11.167}Cr_{0.5}$ | 107 |
| Example 10 | $Lu_{0.57}Y_2Si_{5.5}N_{10}Cr_{0.1}$ | 107 |
| Example 11 | $Gd_{2.6}Si_{6.075}N_{11}Cr_{0.3}$ | 106 |
| Example 12 | $Y_{3.19}Si_6N_{11.2}Cr_{0.01}$ | 106 |
| Example 13 | $Lu_{2.7}Si_6N_{11}Cr_{0.25}Yb_{0.1}$ | 113 |
| Example 14 | $Sc_{52.85}Si_{5.963}N_{11}Cr_{0.1}Nd_{0.1}$ | 112 |
| Example 15 | $La_2Lu_{0.95}Si_{5.8}N_{11.18}Cr_{0.2}Er_{0.3}$ | 112 |
| Example 16 | $La_{2.5}Gd_{0.158}Si_{6.187}N_{11}Cr_{0.05}Yb_{0.05}$ | 115 |
| Example 17 | $La_{0.15}Y_{2.8}Si_6N_{11}Cr_{0.02}Nd_{0.03}$ | 113 |
| Example 18 | $Sc_3Lu_{0.05}Si_{5.753}N_{11}Cr_{0.12}Er_{0.16}$ | 111 |
| Example 19 | $Sc_{0.05}Gd_3Si_{6.113}N_{11.5}Cr_{0.2}Yb_{0.1}$ | 116 |
| Example 20 | $Sc_{2.85}Y_{0.1}Si_{5.888}N_{11}Cr_{0.1}Nd_{0.1}$ | 114 |
| Example 21 | $Lu_{2.65}Gd_{0.1}Si_{5.513}N_{10.5}Cr_{0.2}Er_{0.2}$ | 112 |
| Example 22 | $Gd_{2.85}Y_{0.15}Si_{6.075}N_{11.5}Cr_{0.3}Yb_{0.1}$ | 115 |
| Example 23 | $La_{2.8}Si_6N_{11}Cr_{0.05}Ce_{0.05}Nd_{0.1}$ | 138 |
| Example 24 | $La_{2.8}Si_6N_{11}Cr_{0.05}Ce_{0.05}Yb_{0.1}$ | 142 |
| Example 25 | $La_{2.8}Si_6N_{11}Cr_{0.1}Ce_{0.1}$ | 112 |
| Example 26 | $La_{1.3}ScSi_{6.5}N_{11.167}Cr_{0.1}Ce_{0.1}$ | 109 |
| Example 27 | $Lu_{0.57}Y_{1.9}Si_{5.5}N_{10}Cr_{0.1}Ce_{0.1}$ | 109 |
| Example 28 | $Gd_{2.6}Si_{6.075}N_{11}Cr_{0.2}Ce_{0.1}$ | 107 |
| Example 29 | $Y_{3.09}Si_6N_{11.2}Cr_{0.01}Ce_{0.1}$ | 108 |
| Example 30 | $Lu_{2.7}Si_6N_{11}Cr_{0.1}Ce_{0.1}Yb_{0.1}$ | 120 |
| Example 31 | $Sc_{2.75}Si_{5.963}N_{11}Cr_{0.1}Ce_{0.1}Nd_{0.1}$ | 119 |
| Example 32 | $La_2Lu_{0.95}Si_{5.8}N_{11.18}Cr_{0.2}Ce_{0.1}Er_{0.2}$ | 119 |
| Example 33 | $La_{2.5}Gd_{0.05}Si_{6.187}N11Cr_{0.05}Ce_{0.1}Yb_{0.05}$ | 118 |
| Example 34 | $La_{0.15}Y_{2.7}Si_6N_{11}Cr_{0.02}Ce_{0.1}Nd_{0.03}$ | 118 |
| Example 35 | $Sc_{2.9}Lu_{0.05}Si_{5.753}N_{11}Cr_{0.12}Ce_{0.1}Er_{0.1}$ | 116 |
| Example 36 | $Sc_{0.05}Gd_{2.9}Si_{6.113}N_{11.5}Cr_{0.2}Ce_{0.1}Yb_{0.1}$ | 123 |
| Example 37 | $Sc_{2.75}Y_{0.1}Si_{5.888}N_{11}Cr_{0.1}Ce_{0.1}Nd_{0.1}$ | 125 |
| Example 38 | $Lu_{2.65}Gd_{0.1}Si_{5.513}N_{10.5}Cr_{0.1}Ce_{0.1}Er_{0.2}$ | 124 |
| Example 39 | $Gd_{2.85}Y_{0.15}Si_{6.075}N_{11.5}Cr_{0.2}Ce_{0.1}Yb_{0.1}$ | 126 |

TABLE 1-continued

Relative Emission Intensities of Luminescent Materials in Examples 1-39

| Name | Chemical Composition | Relative Emission Intensity % |
|---|---|---|
| Comparative Example 1 | $La_{2.9}Si_6N_{11}Er_{0.1}$ | 100 |
| Comparative Example 2 | $La_{2.9}Si_6N_{11}Nd_{0.1}$ | 103 |
| Comparative Example 3 | $La_{2.9}Si_6N_{11}Yb_{0.1}$ | 105 |

As can be seen, the excitation wavelengths of the NIR luminescent material recited in the present disclosure lie in the range of 300-650 nm, and the emission main peak of the NIR light region is broadband emission between 900-1100 nm; the excitation wavelength of the luminescent material is relatively broad and capable of excellent absorption of ultraviolet visible light, and has more intensive NIR emission as compared with NIR organic luminescent materials and inorganic luminescent materials of other systems; moreover, the $La_3Si_6N_{11}$ structure is very stable, and has excellent heat resistance, water resistance and light stability.

Examples 40-42

The following Examples 40-42 are directed to light emitting devices produced by NIR fluorescent powder according to the present disclosure as NIR luminescent materials, that is to say, a light emitting device structure known in the prior art is taken as an example, whose structure is as shown in FIG. 6; the light emitting device comprises a base 5, and is provided with a heat sink 4 and a pin 3; the light source of the light emitting device is a semiconductor chip 2, and its optical material portion includes a light converting part I 1 and a light converting part II 6, and a plastic lens 7 is provided at an outer layer thereof. The light converting part I absorbs a primary light emitted by the semiconductor chip 2, and converts the light into a secondary light with higher wavelength; the light converting part II 6 absorbs the primary light of the semiconductor chip 2 and the secondary light emitted by the light converting part I 1, and converts the light into a tertiary light with higher wavelength.

The light emitting device in the following Examples 40-42 is selectively provided with only the light converting part II 6, or simultaneously provided with the light converting part I 1 and the light converting part II 6. The light converting part I 1 at least includes a luminescent material with peak wavelength in the range of 580-660 nm, and the light converting part II 6 at least includes the NIR fluorescent powder recited in the present disclosure.

The emission efficiency of the light emitting device in the following Examples 40-42 is compared with light emitting device 1 that includes the fluorescent material in the above Comparative Example 3 as the luminescent material. The comparative light emitting device 1 uses as light source a semiconductor chip with peak wavelength of 460 nm, and only includes a light converting part II, which contains the NIR fluorescent powder of Comparative Example 1; the fluorescent powder absorbs the NIR light with emission peak wavelength in the range of 950-1050 nm of the light source—suppose its emission efficiency is 100, relative emission efficiencies of the aforementioned various light emitting devices are shown in the following Table 2.

TABLE 2

Structure Information and Relative Emission Efficiencies of
Light Emitting Devices according to the present disclosure

| | Chip | Light Converting Part I | | Light | |
|---|---|---|---|---|---|
| Number | Peak Wavelength nm | Material | Peak Wavelength nm | Converting Part II Material | Relative Emission Efficiency % |
| Example 40 | 460 | | | Example 3 | 132 |
| Example 41 | 460 | $Sr_{1.97}Si_5N_8$:0.03Eu | 600 | Example 5 | 141 |
| Example 42 | 460 | $Ca_{0.49}Sr_{0.49}AlSiN_3$:0.02Eu | 650 | Example 3 | 154 |
| Comparative Example 1 | 460 | | | Comparative Example 3 | 100 |

As can be known from data in the above Table, the light emitting device produced by the NIR fluorescent powder material recited in the present disclosure has higher emission efficiency.

Apparently, the above Examples are merely exemplified to clarify the description, rather than to restrict the modes of execution. Persons ordinarily skilled in the art may make various modifications and variations on the basis of the above description. There is no need and no way to exhaustively enumerate all modes of execution. Any apparent modification or variation extended therefrom shall all be covered within the protection scope of the present disclosure.

What is claimed is:

1. A nitride luminescent material, comprising:
an inorganic compound with the chemical composition $R_wQ_xSi_yN_z$, wherein
the R element is selected from one of an Yb element, an Nd element or an Er element, and comprises a Cr element, or Cr and Ce elements;
the Q element is selected from one or two of an La element, a Gd element, an Lu element, a Y element or an Sc element; and
the parameters w, x, y and z satisfy the following relations: $0<w\leq0.5$, $2.5\leq x+w\leq3.5$, $5.5\leq y\leq6.5$, and $10\leq z\leq12$.

2. The nitride luminescent material according to claim 1, wherein the parameters w, x, y and z satisfy the following relations: $0.01\leq w\leq0.3$, $(x+w):y:z=3:6:11$.

3. The nitride luminescent material according to claim 1, wherein the R element is Cr element and Yb element.

4. The nitride luminescent material according to claim 1, wherein the R element is Cr element, Ce element and Er element.

5. The nitride luminescent material according to claim 1, wherein the inorganic compound has a crystal structure the same as $La_3Si_6N_{11}$.

6. The nitride luminescent material according to claim 1, wherein the Q element is La element.

7. A light emitting device, comprising
a phosphor; and
an excitation light source, wherein
the phosphor comprises the nitride luminescent material according to claim 1.

8. The light emitting device according to claim 7, wherein the light emitting device comprises a semiconductor chip (2), a light converting part I (1) and a light converting part II (6); the light converting part I (1) absorbs a primary light emitted by the semiconductor chip (2), and converts the light into a secondary light with higher wavelength;
the light converting part II (6) absorbs the primary light of the semiconductor chip (2) and the secondary light emitted by the light converting part I (1), and converts the light into a tertiary light with higher wavelength; and
the light converting part I (1) at least comprises a nitride luminescent material I, and the light converting part II (6) at least comprises the nitride luminescent material according to claim 1.

9. The light emitting device according to claim 8, wherein the nitride luminescent material I is a luminescent material capable of emitting an emitted light with a peak wavelength of 580-650 nm under excitation by the semiconductor chip (2).

10. The light emitting device according to claim 8, wherein the nitride luminescent material I is selected from one or two luminescent material(s) with a general formula of $M_mAl_aSi_bN_c$:$Eu_d$ or $M_eSi_fN_g$:$Eu_n$, wherein
the M element at least comprises a Ca element and/or a Sr element; and
the parameters m, a, b, c, d, e, f, g and n satisfy the following relations: $0.8\leq m\leq1.2$, $0.8\leq a\leq1.2$, $0.8\leq b\leq1.2$, $2\leq c\leq4$, $0.0001\leq d\leq0.1$, $1.8\leq e\leq2.2$, $4\leq f\leq6$, $7\leq g\leq9$, and $0.0001\leq n\leq0.1$.

11. The light emitting device according to claim 8, wherein the nitride luminescent material I has a crystal structure as $CaAlSiN_3$ or $Sr_2Si_5N_8$.

12. The light emitting device according to claim 8, wherein, in the nitride luminescent material I, the M element is Ca and Sr elements, wherein the Sr element has a molar percentage z in the M element, and $80\%\leq z\leq100\%$.

13. The light emitting device according to claim 8, wherein the semiconductor chip (2) has an emission peak wavelength in the range of 350-500 nm, preferably 440-460 nm.

14. A nitride luminescent material, comprising an inorganic compound with the chemical composition $R_wQ_xSi_yN_z$, wherein
the R element is selected from one of an Yb element, an Nd element or an Er element, and comprises a Cr element, or Cr and Ce elements;
the Q element is selected from one or two of an La element, a Gd element, an Lu element, a Y element or an Sc element;
the parameters w, x, y and z satisfy the following relations: $0<w\leq0.5$, $2.5\leq x+w\leq3.5$, $5.5\leq y\leq6.5$, and $10\leq z\leq12$;
the parameters w, x, y and z satisfy the following relations: $0.01\leq w\leq0.3$, $(x+w):y:z=3:6:11$; and wherein the R element is Cr element and Yb element;
wherein the inorganic compound has a crystal structure the same as $La_3Si_6N_{11}$; and
the Q element is La element.

15. A light emitting device, comprising a phosphor; and an excitation light source, wherein the phosphor comprises the nitride luminescent material according to claim 14.

16. The light emitting device according to claim 15, wherein the light emitting device comprises a semiconductor chip (2), a light converting part I (1) and a light converting part II (6); the light converting part I (1) absorbs a primary light emitted by the semiconductor chip (2), and converts the light into a secondary light with higher wavelength; the light converting part II (6) absorbs the primary light of the semiconductor chip (2) and the secondary light emitted by the light converting part I (1), and converts the light into a tertiary light with higher wavelength; and
the light converting part I (1) at least comprises a nitride luminescent material I, and the light converting part II (6) at least comprises the nitride luminescent material according to claim 14.

17. The light emitting device according to claim 16, wherein the nitride luminescent material I is a luminescent material capable of emitting an emitted light with a peak wavelength of 580-650 nm under excitation by the semiconductor chip (2).

18. The light emitting device according to claim 17, wherein the nitride luminescent material I is selected from one or two luminescent material(s) with a general formula of $M_mAl_aSi_bN_c:Eu_d$ or $M_eSi_fN_g:Eu_n$, wherein
the M element at least comprises a Ca element and/or a Sr element; and
the parameters m, a, b, c, d, e, f, g and n satisfy the following relations: 0.8≤m≤1.2, 0.8≤a≤1.2, 0.8≤b≤1.2, 2≤c≤4, 0.0001≤d≤0.1, 1.8≤e≤2.2, 4≤f≤6, 7≤g≤9, and 0.0001≤n≤0.1; and
the nitride luminescent material I has a crystal structure as $CaAlSiN_3$ or $Sr_2Si_5N_8$.

19. The light emitting device according to claim 18, wherein in the nitride luminescent material I, the M element is Ca and Sr elements, wherein the Sr element has a molar percentage z in the M element, and 80%≤z≤100%.

20. The light emitting device according to claim 19, wherein the semiconductor chip (2) has an emission peak wavelength in the range of 350-500 nm, preferably 440-460 nm.

* * * * *